(12) United States Patent
Kudo (10) Patent No.: US 7,554,388 B2
(45) Date of Patent: Jun. 30, 2009

(54) INTEGRATED CIRCUIT APPARATUS

(75) Inventor: Masahiro Kudo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/016,455

(22) Filed: Jan. 18, 2008

(65) Prior Publication Data
US 2008/0174355 A1      Jul. 24, 2008

(30) Foreign Application Priority Data
Jan. 19, 2007      (JP)     ............................... 2007-010793

(51) Int. Cl.
*H03B 1/00*        (2006.01)
*H03K 5/00*        (2006.01)
*H04B 1/10*        (2006.01)

(52) U.S. Cl. ........................ 327/553; 327/552; 327/554

(58) Field of Classification Search ................. 327/552, 327/553, 554, 337, 558, 94, 95, 96
See application file for complete search history.

(56) References Cited

U.S. PATENT DOCUMENTS 5,466,976 A      11/1995   Ichihara
6,509,791 B2 *   1/2003    Segawa et al.   ............... 327/554

2003/0169101 A1   9/2003   Yamamoto et al.

FOREIGN PATENT DOCUMENTS

| JP | 5-180881    | 7/1993 |
| JP | 2000-004143 | 1/2000 |
| JP | 2003-258604 | 9/2003 |

* cited by examiner

*Primary Examiner*—Tuan Lam
*Assistant Examiner*—Daniel Rojas
(74) *Attorney, Agent, or Firm*—Arent Fox LLP (57) ABSTRACT

According to an aspect of an embodiment, an apparatus comprises:
a first current source and a second current source; a resistor connected between the first current source and a reference potential portion; a switched capacitor circuit having a variable capacitor, first switch and a second switch, the first switch and second switch alternately switching capable of charging a voltage to the variable capacitor and capable of discharging a electric charge of the variable capacitor; an integrating circuit having an output terminal and a first input terminal which is connected a portion between the second current source and the switched capacitor circuit, an integrating circuit for integrating a current from the portion and for exchanging into an output voltage of the output terminal; and a comparator for comparing the voltage between two end of the resistor and an output voltage of the integrating circuit.

8 Claims, 6 Drawing Sheets

INTEGRATED CIRCUIT APPARATUS

BACKGROUND

This art relates to an integrated circuit that includes variable capacitive elements.

When an analog circuit, such as a filter or an amplifier, is provided in a semiconductor integrated circuit, a resistive element and a capacitive element need to be used. For example, a filter can be comprised with a resistor, a capacitor, the capacitance of which is variable, and an operational (OP) amplifier. For example, a first-order high-pass filter can be comprised by providing a first resistor at an input terminal of an OP amplifier, a second resistor between the input terminal and an output terminal of the OP amplifier, and a capacitor in series with the first resistor. Moreover, a first-order low-pass filter can be comprised by providing the capacitor in parallel with the second resistor. A second-order band-pass filter can be comprised by providing the capacitor in series with the first resistor, and a capacitor in parallel with the second resistor. In such filters, cut-off frequencies are determined from a time constant that is the product of resistance and capacitance.

Circuits, such as the aforementioned filters, are included in recent semiconductor integrated circuits for radio transceivers. In filters in radio transceivers, it is necessary to accurately cut out desired signals, and variation in cut-off frequencies may cause a malfunction. On the other hand, when resistive elements and capacitive elements are fabricated in semiconductor integrated circuits at the same time, the element value may vary due to manufacturing errors. Moreover, the element value may vary with the operating temperature in a manner that depends on the temperature characteristics. For example, if there are an error of up to ±20% in the capacitance of a capacitive element and an error of up to ±20% in the resistance of a resistive element, these errors for a time constant results is up to more than ±40% in a target time constant.

Thus, it is necessary to control a time constant that is the product of resistance and capacitance to achieve desired cut-off frequencies. One of such methods is a method for controlling a time constant by changing the capacitance of a capacitor used in a filter. Techniques for controlling the capacitance of a capacitor provided in a filter are disclosed in Laid-open Japanese Patent Publication Number 5-180881, Laid-open Japanese Patent Publication Number 2003-258604, and Laid-open Japanese Patent Publication Number 2000-4143.

When a time constant based on manufacturing errors is controlled by changing a capacitance, as described above, the time constant needs to be measured. In this case, a problem exists in that the time constant may not be measured accurately due to the accuracy of a reference supply, a reference current source, and the like that comprises a measuring circuit.

SUMMARY

According to an aspect of an embodiment, an apparatus comprises:

a current source circuit comprising a first current source and a second current source;

a resistor connected between the first current source and a reference potential portion;

a switched capacitor circuit having a variable capacitor, first switch and a second switch, the first switch and the second switch connected to end of terminals of the variable capacitor, respectively, the first switch and second switch alternately switching capable of charging a voltage to the variable capacitor and capable of discharging a electric charge of the variable capacitor;

an integrating circuit having an output terminal and a first input terminal which is connected a portion between the second current source and the switched capacitor circuit, an integrating circuit for integrating a current from the portion and for exchanging into an output voltage of the output terminal; and a comparator for comparing the voltage between two end of the resistor and an output voltage of the integrating circuit.

DESCRIPTION OF THE PREFERRED EMBODIMENTS

According to the present embodiment will now be described with reference to the drawings. Configurations according to the embodiments are exemplary configurations, and the present embodiment is not limited to the configurations according to the embodiments.

First Embodiment

Figure 1:
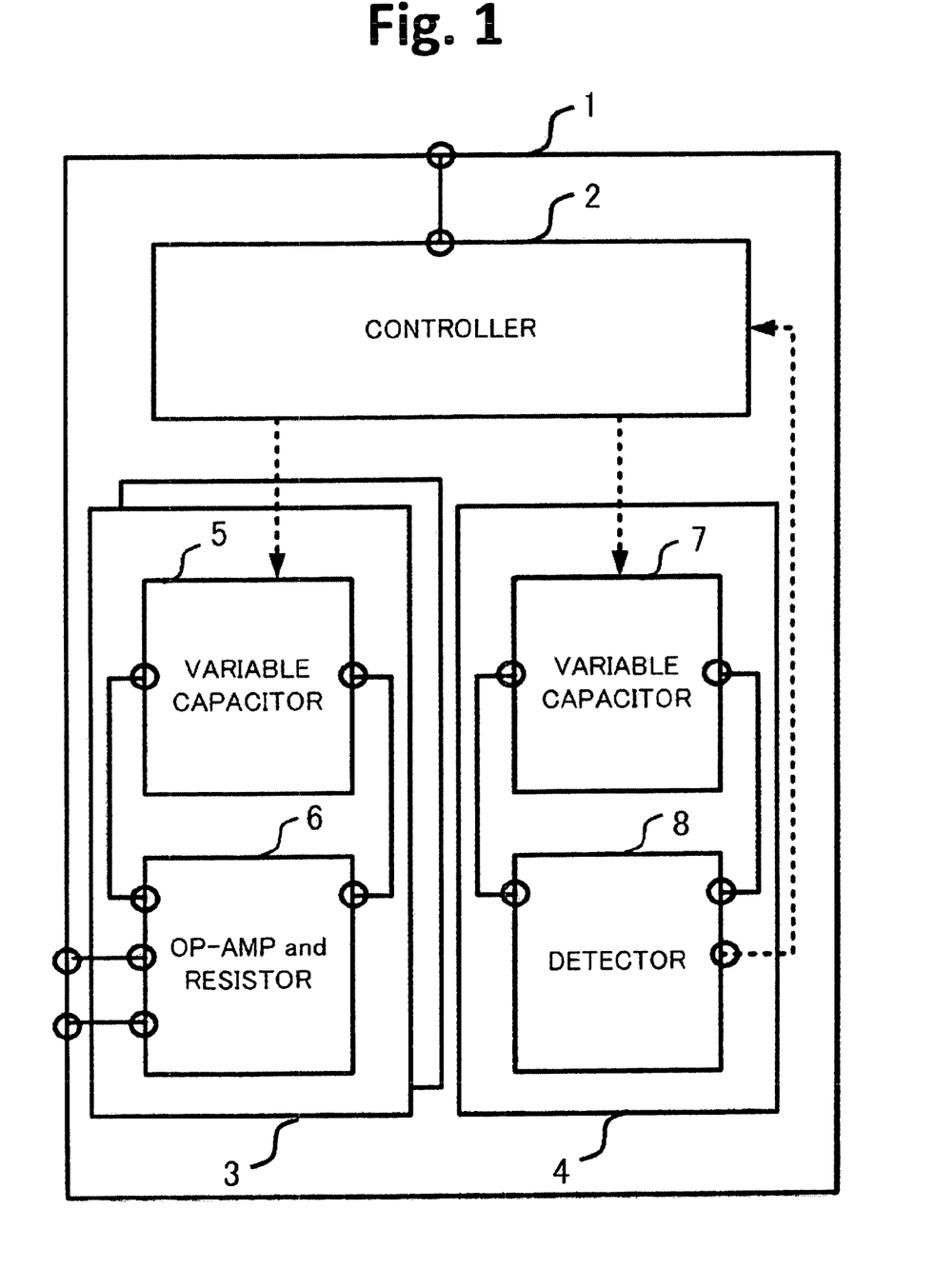
FIG. 1 shows a semiconductor integrated circuit according to a first embodiment.

FIG. 1 shows a semiconductor integrated circuit according to a first embodiment of the present embodiment. Reference numeral 1 denotes the semiconductor integrated circuit 1. Reference numeral 2 denotes a control circuit. Reference numeral 3 denotes a filter unit. Reference numeral 4 denotes a detector unit. Reference numerals 5 and 7 denote variable capacitors. Reference numeral 6 denotes a filter component circuit. Reference numeral 8 denotes a detector circuit.

The control circuit 2, the filter unit 3, and the detector unit 4 are provided on the semiconductor integrated circuit 1. The filter unit 3 includes the variable capacitor 5 and the filter component circuit 6. The filter component circuit 6 is a circuit part, other than the variable capacitor 5, that comprises the filter unit 3. The detector unit 4 includes the detector circuit 8 and the variable capacitor 7 subjected to detection. The variable capacitor 7 is provided on the same semiconductor substrate as the variable capacitor 5. Thus, measuring the capacitance of the variable capacitor 7 is equivalent to measuring the capacitance of the variable capacitor 5. The control circuit 2 adjusts the capacitance of the variable capacitor 5 in the filter unit 3 to an appropriate value on the basis of a time constant detected by the detector unit 4. The individual components will now be described in detail.

[Semiconductor Integrated Circuit]

The semiconductor integrated circuit 1 is, for example, a semiconductor integrated circuit for a radio transceiver. For example, a semiconductor integrated circuit for a radio transceiver includes an OP amplifier and a filter circuit that includes a resistive element and a capacitive element connected to each other. In a filter circuit for a radio transceiver, since it is necessary to accurately cut out signals to be processed, there is a demand to accurately set and control cut-off frequencies.

[Control Circuit]

The control circuit 2 performs control to change the time constant of a filter to an appropriate value so as to achieve target cut-off frequencies in the filter. Specifically, the detector unit 4 has a function of comparing a time constant that is the product of the capacitance of the variable capacitor 7 and the resistance of a reference resistor in the detector circuit 8 with a reference time constant. The control circuit 2 sets the capacitance of the variable capacitor 7 in the detector unit 4, and the detector unit 4 compares time constants. Then, the control circuit 2 searches for an appropriate capacitance of the variable capacitor 7 on the basis of the result of the comparison to achieve a desired time constant. Then, the control circuit 2 controls the capacitance of the variable capacitor 5 on the basis of the result of searching for an appropriate capacitance of the variable capacitor 7.

In a configuration in which such a control circuit is provided, the capacitance of the variable capacitor 5 in an actual unit can be controlled on the basis of the capacitance of the variable capacitor 7 such that a time constant detected by the reference resistor and the variable capacitor 7 in a replica reaches a desired value. That is to say, the control circuit 2 can indirectly determine variation in the element value due to the manufacturing errors and temperature characteristics of the resistive element and the capacitive element in the filter unit 3, which actually operates, and control the capacitance. The control circuit 2 according to the first embodiment performs control using the variable capacitor 7 other than the variable capacitor 5, which actually constitutes a filter, so as to determine the capacitance. In this configuration, control can be performed to correct the capacitance even while the variable capacitor 5, which actually constitutes a filter, is operating.

[Filter Unit]

The filter unit 3 includes the variable capacitor 5 and the filter component circuit 6 connected to each other. Specifically, the variable capacitor 5 is provided between an inverting input terminal and an output terminal of an OP amplifier so as to provide a negative feedback system.

When a low-pass filter is comprised with the filter unit 3, the variable capacitor 5 is provided between the inverting input terminal and the output terminal of the OP amplifier, which constitutes the filter component circuit 6. When a high-pass filter is comprised, the variable capacitor 5 is provided at an input terminal of the OP amplifier, which comprises the filter component circuit 6. When a band-pass filter is comprised, the variable capacitors 5 are provided between the inverting input terminal and the output terminal of the OP amplifier, which constitutes the filter component circuit 6, and at the input terminal of the OP amplifier. When a second- or higher-order filter or a band-pass filter is comprised, a plurality of the variable capacitors 5 is needed.

[Detector Unit]

The detector unit 4 includes the variable capacitor 7 and the detector circuit 8. The detector circuit 8 compares the integral of a current generated from electric charge that is periodically charged to a switched capacitor in which the variable capacitor 7 is used with the integral of a current from a current source 22 shown in FIG. 4. The result of the comparison is output to the control circuit 2.

[Variable Capacitors]

Figure 2:
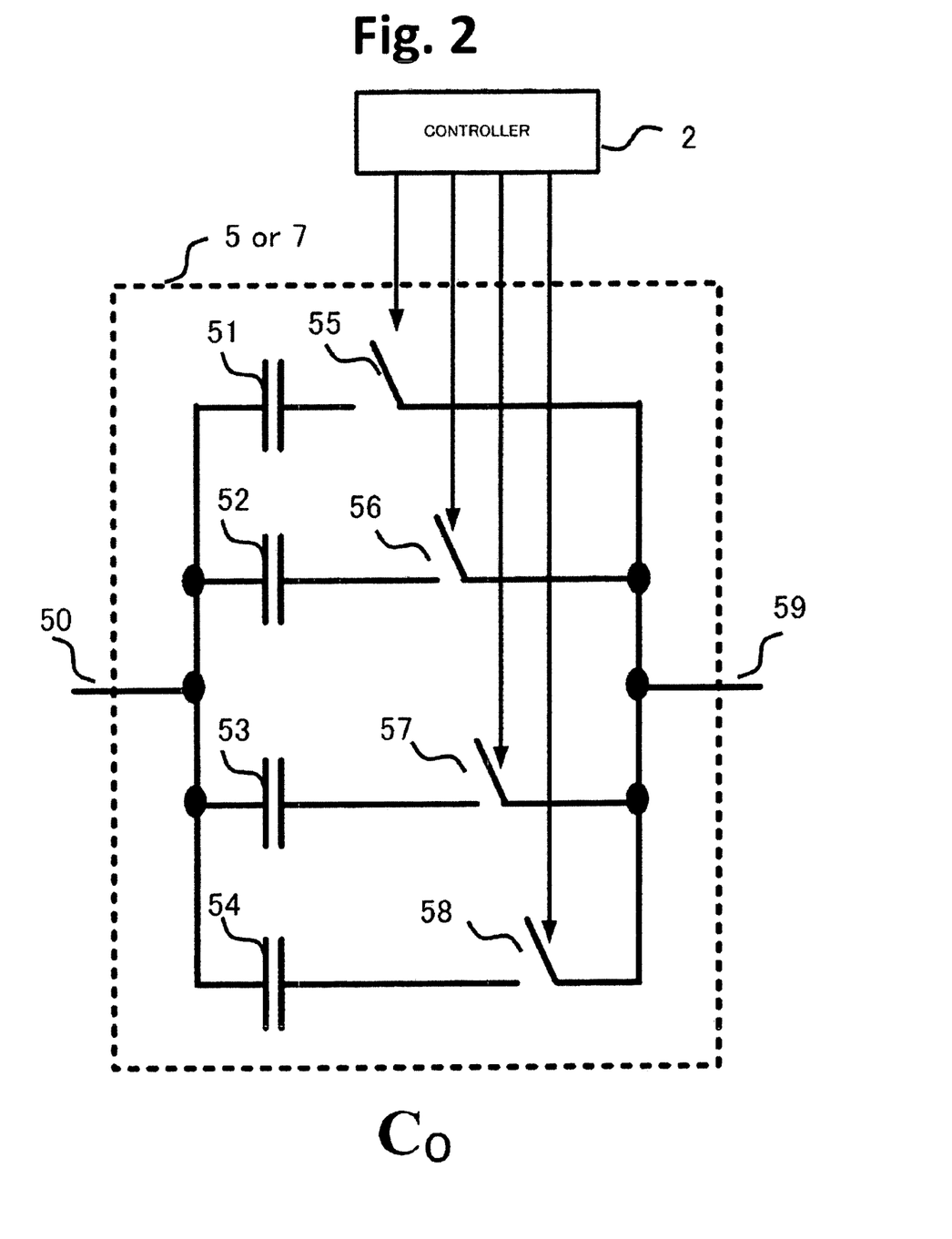
FIG. 2 shows the configuration of a variable capacitor according to the first embodiment.

FIG. 2 shows an exemplary configuration of each of the variable capacitors 5 and 7. Each of the variable capacitors 5 and 7 can be comprised with a capacitor array in which a plurality of capacitive elements is connected in parallel. In this configuration, four capacitive elements 51 to 54 are used. In each of the variable capacitors 5 and 7, switches 55 to 58 for selecting the corresponding capacitive elements 51 to 54 are connected in series with the corresponding capacitive elements 51 to 54. The capacitance of each of the variable capacitors 5 and 7 can be changed by turning on or off the switches 55 to 58 by control signals from the control circuit 2. When the variable capacitor 5, which performs signal processing of an actual unit, and the variable capacitor 7, which is a replica of the actual unit, share side effects including parasitic capacitance and the like, the accuracy of control of the capacitance is improved. Thus, it is preferable that the variable capacitors 5 and 7 be comprised with the same capacitor array.

[Exemplary Configuration of the Filter Unit]

Figure 3A:
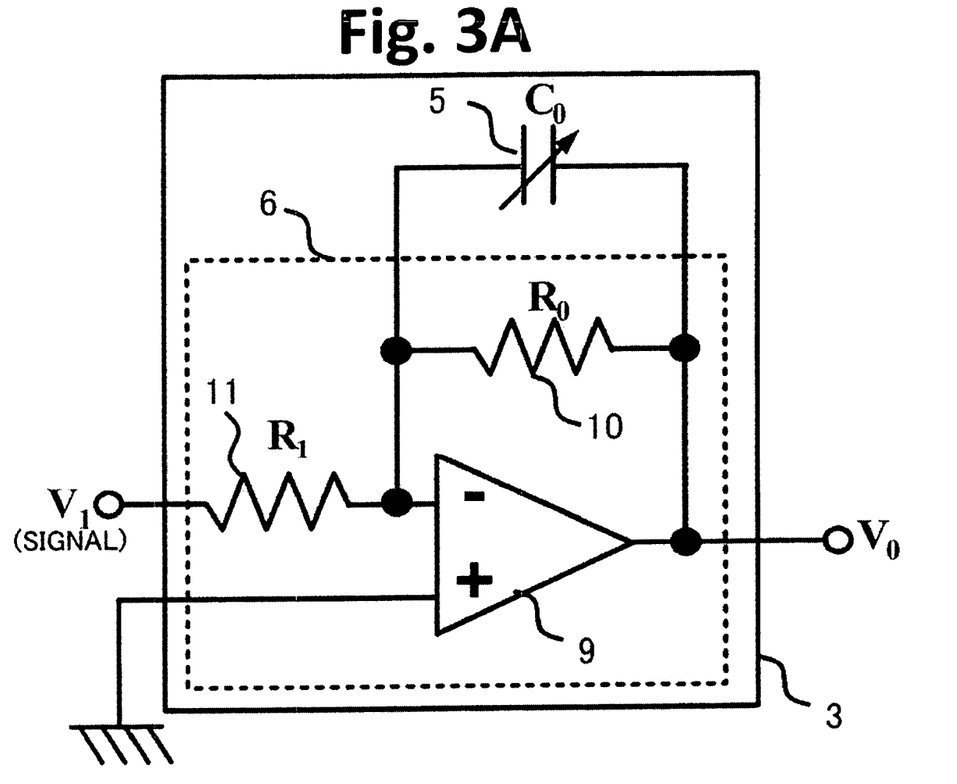
FIG. 3A shows the configuration of a filter unit according to the first embodiment.

FIG. 3A shows an exemplary configuration of the filter unit 3. FIG. 3A shows a first-order low-pass filter as an embodiment. However, the present embodiment is not limited to a configuration of a first-order filter or a low-pass filter and may be applied to any circuit configuration as long as the circuit configuration includes a resistor and a variable capacitor. The filter unit 3 shown in FIG. 3A includes the filter component circuit 6, which includes an OP amplifier 9 and resistors 10 and 11, and the variable capacitor 5. The resistor 11 has a resistance of $R_1$ and is connected to an inverting input terminal of the OP amplifier 9. The resistor 10 has a resistance of $R_0$. The variable capacitor 5 has a configuration shown in FIG. 2, extends between the inverting input terminal and an output terminal of the OP amplifier 9, and has a capacitance of $C_0$. The value $C_0$ can be changed by turning on or off the switches 55 to 58 shown in FIG. 2.

Figure 3B:
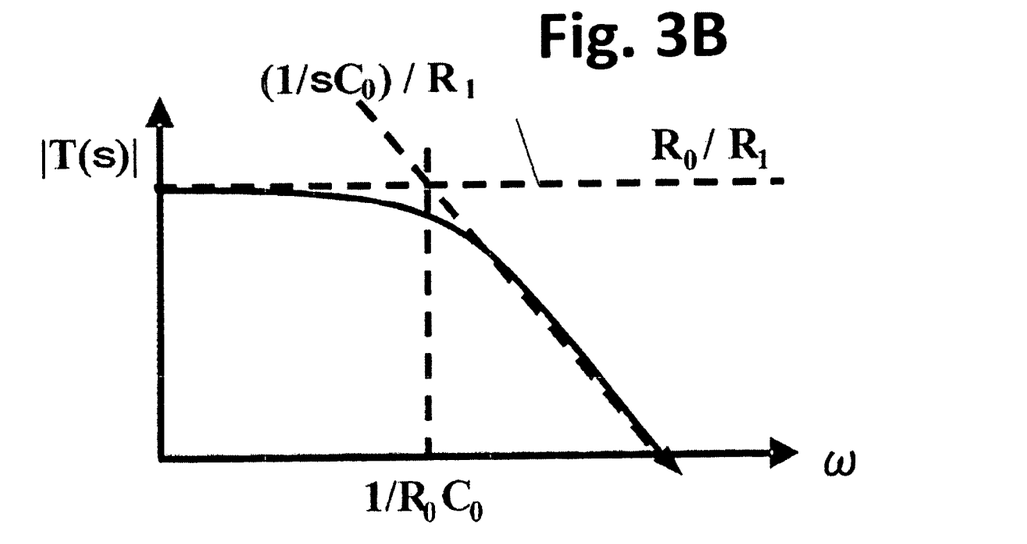
FIG. 3B shows characteristics of the filter unit according to the first embodiment.

FIG. 3B shows characteristics of the filter unit 3. The graph of an expression $1/R_0C_0$ indicated by a dotted line shows the cut-off frequency of the filter unit 3 shown in FIG. 3A. The graph of an expression $R_0/R_1$ indicated by a dotted line shows the direct current gain. The graph of an expression $(1/sC_0)/R_1$ indicated by a dotted line shows the gain in an attenuation band. The aforementioned three expressions show that desired cut-off frequencies can be achieved by changing the capacitance value $C_0$ of the variable capacitor 5.

[Exemplary Configuration of the Detector Unit]

Figure 4:
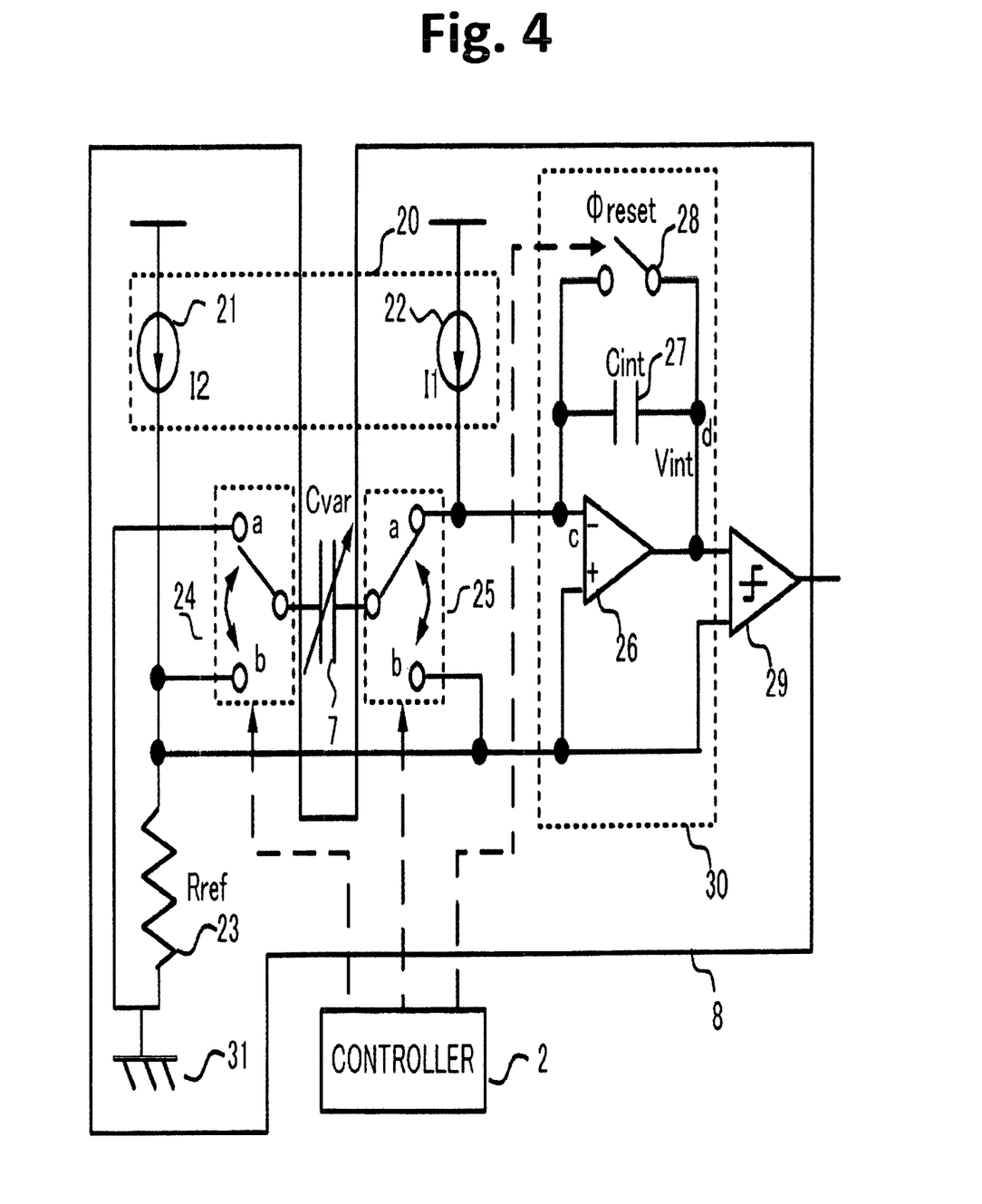
FIG. 4 shows an exemplary configuration of a detector unit according to the first embodiment.

FIG. 4 shows an exemplary configuration of the detector unit 4. The detector unit 4 includes the variable capacitor 7 and the detector circuit 8.

The detector circuit 8 includes a current source circuit 20, a switched capacitor circuit that includes the variable capacitor 7 and switches 24 and 25, an integration circuit 30, a reference resistor 23, a reference potential 31, and a comparator circuit 29 described below.

[Current Source Circuit]

The current source circuit 20 includes a current source 21 and the current source 22. The current source 21 has a current value of I2. The current source 22 has a current value of I1. The reference resistor 23 has a resistance of Rref and is connected between the current source 21 and the reference potential 31 (for example, a ground). Thus, a voltage of Vref that is the product of I2 and Rref is generated across the reference resistor 23.

[Switched Capacitor Circuit]

The switches 24 and 25 are provided at terminals of the variable capacitor 7. Each of the switches 24 and 25 is switched to a position on the side of a terminal a or a position on the side of a terminal b by predetermined periodic signals having a frequency of Fclk from the control circuit 2. It is most preferable that these control signals be non-overlapping signals such that the switches 24 and 25 are not turned on the terminals a and b at the same time. Moreover, when the switches 24 and 25 are turned off, variation in charge injection in the switched capacitor can be reduced by turning off the switch 25, which is always kept at a substantially constant potential, a moment earlier. The terminal a of the switch 24 is connected to the reference potential 31. The terminal b of the switch 24 is connected between the reference resistor 23 and the current source 21. The terminal a of the switch 25 is connected to the integration circuit 30. The terminal b of the switch 25 is connected between the reference resistor 23 and the current source 21. When each of the switches 24 and 25 is switched to the position of the terminal b, for the time of ½Fclk, the terminals of the variable capacitor 7 are shorted, and the variable capacitor 7 is discharged. When each of the switches 24 and 25 is switched to the position of the terminal a, for the time of ½Fclk, the switch 24 side of the variable capacitor 7 is grounded, and the potential of the switch 25 side of the variable capacitor 7 is kept at Vref (=I2×Rref) by the effect of the virtual ground of an OP amplifier. Thus, the variable capacitor 7 is charged to a voltage of −Vref, the switch 24 side being positive. In the switched capacitor circuit, charging and discharging are alternately repeated by predetermined periodic signals from the control circuit 2.

[Integration Circuit]

The integration circuit 30 includes an OP amplifier 26, a capacitive element 27, and a switch 28. An inverting input terminal c of the OP amplifier 26 is connected to the current source 22 and the switch 25. A non-inverting input terminal of the OP amplifier 26 is a current input terminal of the integration circuit 30. The capacitive element 27 extends between the inverting input terminal c and an output terminal of the OP amplifier 26. The switch 28 is connected in parallel with the capacitive element 27. The capacitive element 27 is discharged by turning on the switch 28 by control signals from the control circuit 2 so as to reset the integral.

[Comparator Circuit]

The comparator circuit 29 compares the voltage of the output terminal of the OP amplifier 26 with a voltage generated across the reference resistor 23. The comparator circuit 29 is comprised with an OP amplifier, a latch circuit, or an analog-to-digital converter so that the output terminal of the OP amplifier 26 is connected to a first input terminal of the comparator circuit 29, and a voltage generated across the reference resistor 23 is input to a second input terminal of the comparator circuit 29. The comparator circuit 29 compares the voltages of the two input terminals. Then, for example, the comparator circuit 29 outputs, to the control circuit 2, a signal at the high level when the voltage of the first input terminal is higher than the voltage of the second input terminal, and a signal at the low level when the voltage of the first input terminal is lower than the voltage of the second input terminal.

[Waveforms for FIG. 4]

Figure 5:
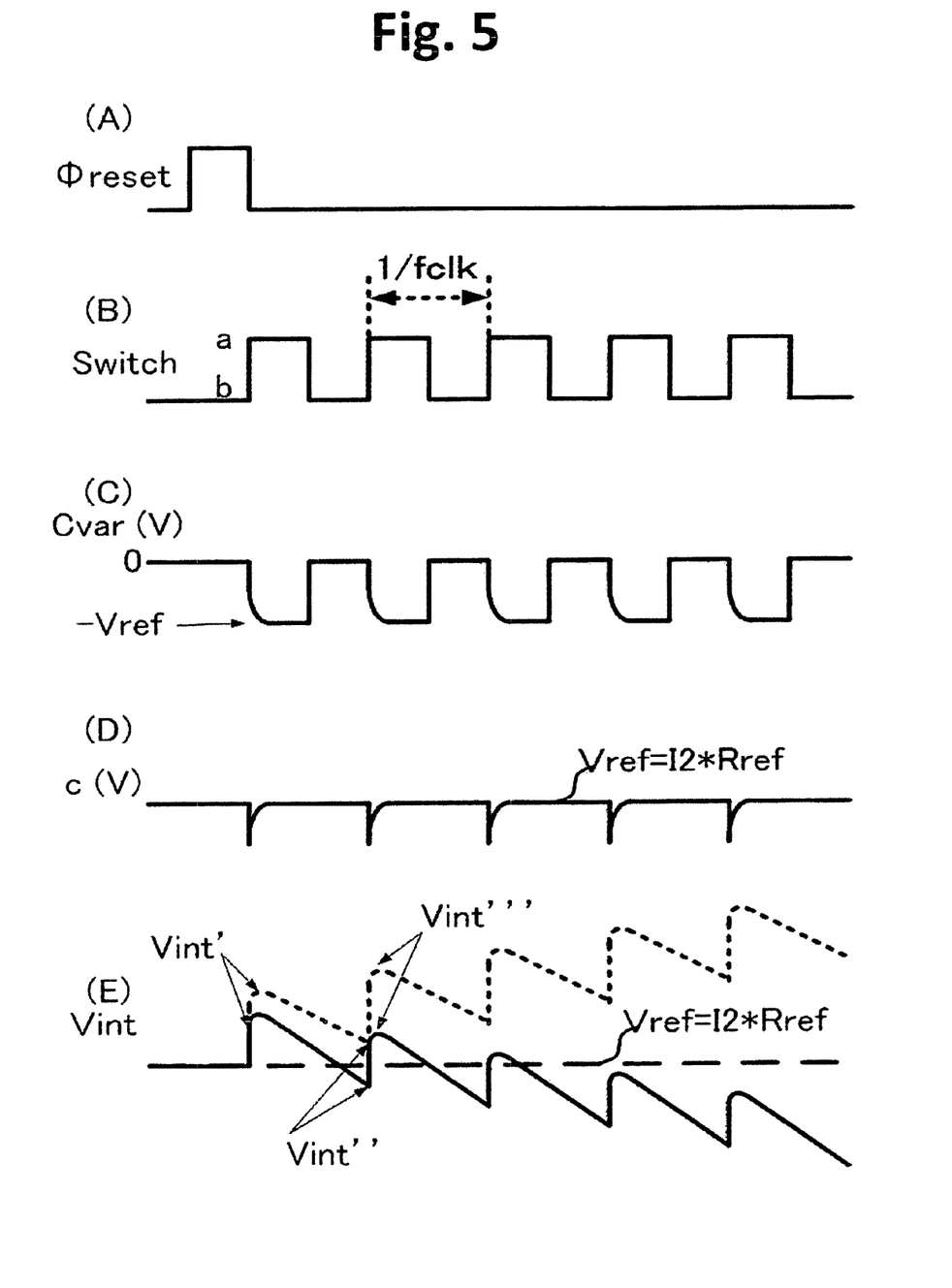
FIG. 5 shows the state of signals in individual components in the detector unit according to the first embodiment.

FIG. 5 shows the state of signals in the individual components in the detector unit 4 during the process of determining a time constant. FIG. 5 shows waveforms in a case where the current supply capacity of the OP amplifier 26 is limited.

A waveform shown by a curve (A) shows the timing of a signal φreset supplied to the switch 28. The signal φreset rises at the beginning of the process of determining a time constant, so that the switch 28 is turned on. As a result, the capacitive element 27 is discharged, so that the integral is reset.

A waveform shown by a curve (B) shows the timing of a signal supplied to each of the switches 24 and 25. When the signal is at the high level, each of the switches 24 and 25 is switched to the position of the terminal a. When the signal is at the low level, each of the switches 24 and 25 is switched to the position of the terminal b. A set of a signal at the high level and a signal at the low level is repeated with a period of 1/Fclk.

A waveform shown by a curve (C) shows the voltage (assuming that the switch 24 side is positive) across the variable capacitor 7 having a capacitance of Cvar. When the switches 24 and 25 are connected to the corresponding terminals b, the variable capacitor 7 is discharged. When the variable capacitor 7 is discharged, the voltage is zero. When the switches 24 and 25 are connected to the corresponding terminals a, a voltage of −Vref (=I2×Rref) is applied to the variable capacitor 7. Since the switch 25 connects the variable capacitor 7 to the inverting input terminal c of the OP amplifier 26, the variable capacitor 7 is charged to −Vref by the OP amplifier 26.

A waveform shown by a curve (D) shows the waveform of the voltage of the inverting input terminal c of the OP amplifier 26. When the switches 24 and 25 are switched to the positions on the terminal a side, the switch 24 side of the variable capacitor 7 having a voltage of Vref is grounded. A negative voltage occurs on the inverting input terminal c of the OP amplifier 26 for a moment by this operation. Subsequently, the voltage of the inverting input terminal c returns to Vref by charging of the capacitive element 27 by the OP amplifier 26. At the same time, the variable capacitor 7 having the capacitance of Cvar is also charged until the voltage across the variable capacitor 7 reaches a voltage of −Vref (=I2×Rref).

A waveform shown by a curve (E) shows the waveform of a voltage Vint of an output point d in the integration circuit 30. The value of the voltage Vint of the point d is Vref just after the capacitive element 27 is discharged by the switch 28. When the switch 28 is turned off, a current I1 from the current source 22 is integrated in the capacitive element 27 in the integration circuit 30, so that the output voltage of the integration circuit 30 changes with a constant slope of I1/Cint where Cint is the capacitance of the capacitive element 27. When, in the switched capacitor, a status in which the switches 24 and 25 are connected to the corresponding terminals b so as to perform discharging transitions to a status in which the switches 24 and 25 are connected to the corresponding terminals a, electric charge Q that is the same as electric charge to be charged to the variable capacitor 7 having the capacitance of Cvar is charged to the capacitive element 27 in the integration circuit 30 by the OP amplifier 26. Since the electric charge Q is equal to the product of Vref and Cvar, a voltage to be integrated in the capacitive element 27 in the integration circuit 30 for each period of 1/Fclk of the operation of the switched capacitor is (Vref×Cvar)/Cint. In this manner, the value of Vint just after the switch 28 is turned off becomes a voltage value of Vint' obtained by adding a voltage of (Vref×Cvar)/Cint to the first voltage (I2×Rref). The voltage value of Vint' decreases with the slope of I1/Cint and becomes a voltage value of Vint". Then, after the time of 1/Fclk has elapsed, the switches 24 and 25 are again switched to the positions on the terminal a side, so that electric charge Vref×Cvar is integrated. Thus, a voltage of (Vref×Cvar)/Cint is added to the decreasing voltage value, so that a voltage value of Vint''' is reached. Then, for the time of 1/Fclk, the voltage decreases. This operation is repeated until the next reset signal φreset is sent. Thus, when electric charge Vref×Cvar to be accumulated in Cvar with a period of Fclk is larger than the current I1, the value of Vint increases. In this case, the curve (E) deviates from a horizontal line showing the level of Vref, as indicated by a dotted line, so that the value of Vint increases. On the other hand, when electric charge Vref×Cvar to be accumulated in Cvar with the period of Fclk is smaller than the current I1, the value of Vint decreases. In this case, the curve (E) deviates from the horizontal line showing the level of Vref, as indicated by a solid line, so that the value of Vint decreases. In a status in which sufficient time has elapsed, a difference corresponding to the difference between the product of Vref, Cvar, and Fclk and the value of I1 occurs between Vint and Vref. Thus, the comparator circuit 29 can readily determine which of Vint and Vref is larger. Since Vref=I2×Rref, the comparator circuit 29 can determine which of the product of I2, Rref, Cvar, and Fclk and the value of I1 is larger. That is to say, it can be determined which of the product of Rref and Cvar and the value I1 divided by I2 divided by Fclk is larger, so that a constant that is the product of the resistance of Rref of the reference resistor 23 and the capacitance of Cvar of the variable capacitor 7 can be compared with a reference time constant that is obtained by multiplying the inverse of the frequency of Fclk of periodic signals by the ratio of the current value I1 of the current source 22 to the current value I2 of the current source 21.

The control circuit 2 changes the capacitance of the variable capacitor 5 on the basis of the result of the comparison, resets the integration circuit 30 in the detector circuit 8, and then performs the next comparison. Such comparison is repeated to gradually narrow down the range of the capacitance of the variable capacitor such that a time constant that is the product of the resistance of Rref of the reference resistor 23 and the capacitance of Cvar of the variable capacitor 7 is substantially the same as the reference time constant. In this case, the reference time constant is determined by the frequency of Fclk of periodic signals and the ratio (I1/I2) of the current value I1 to the current value I2. Thus, an absolute accuracy is not required for each of the current values I1 and I2, and the accuracy of the reference time constant can be ensured by ensuring accuracy in the ratio between I1 and I2. In a semiconductor integrated circuit, two current sources, the ratio between the current values of which is accurate, can be readily provided as, for example, a reference current source and a current mirror circuit.

In FIG. 5, in an ideal status in which the gain of the OP amplifier 26 is infinite, the voltage of the inverting input terminal c is always Vref, and the waveform at points corresponding to the values Vint' and Vint''' of the voltage Vint is not rounded but sharp. Moreover, the waveform shown in FIG. 5 may be turned upside down in a manner that depends on the polarity of the current of the current source.

Second Embodiment

Figure 6:
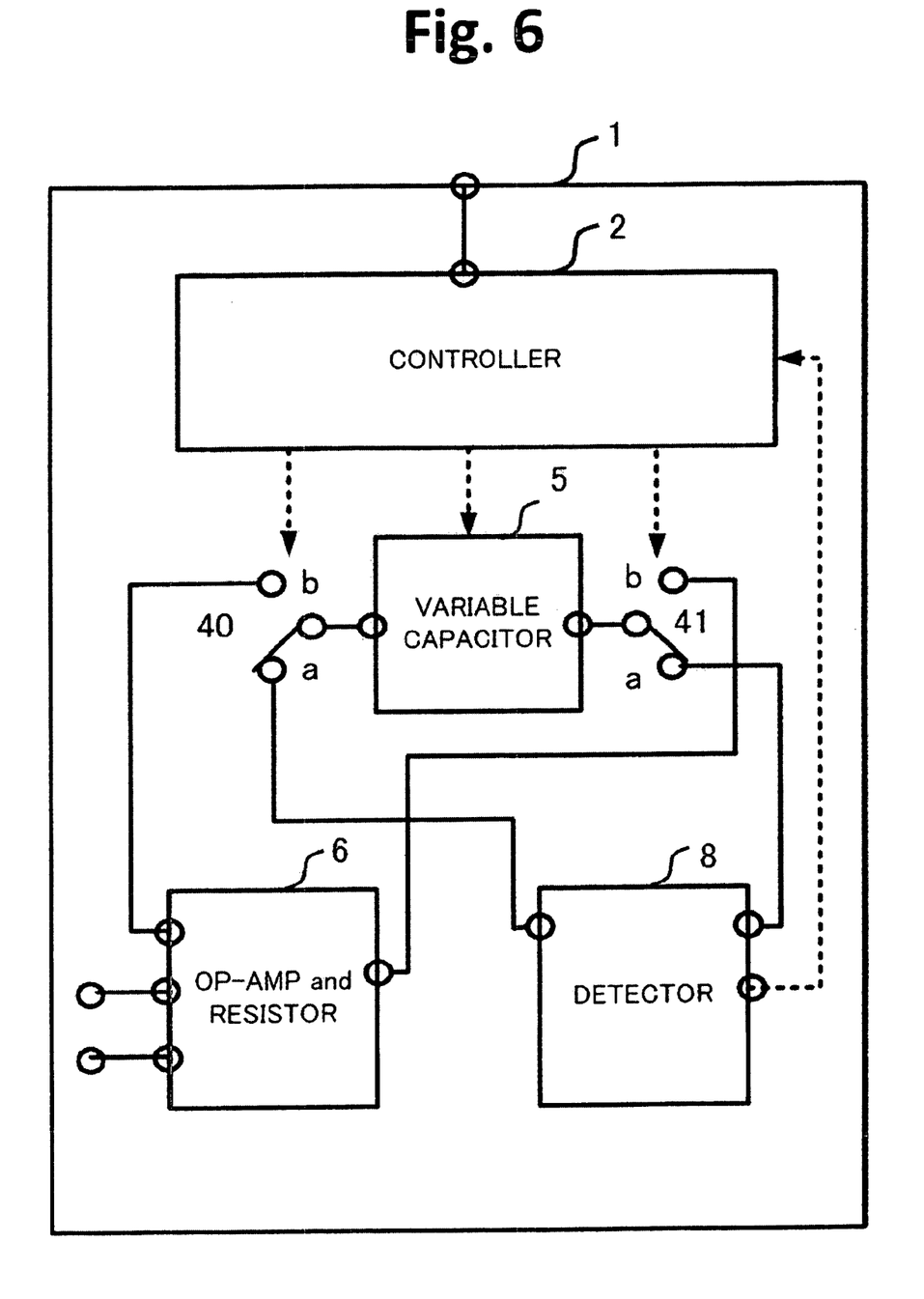
FIG. 6 shows a semiconductor integrated circuit according to a second embodiment in which the capacitance of a variable capacitor used in a filter is directly used.

FIG. 6 shows a semiconductor integrated circuit according to a second embodiment of the present embodiment in which the capacitance of the variable capacitor 5 used in a filter is directly used. In FIG. 6, the components of the filter component circuit 6 and the detector circuit 8 are the same as those in the first embodiment.

Switches 40 and 41 are provided at terminals of the variable capacitor 5. When each of the switches 40 and 41 is connected to a terminal on an a side, the variable capacitor 5 is connected to the detector circuit 8. When each of the switches 40 and 41 is connected to a terminal on a b side, the variable capacitor 5 is connected to the filter component circuit 6. The control circuit 2 changes the circuit to which the variable capacitor 5 is connected by switching each of the switches 40 and 41 to a position on the a or b side.

In a specific operation, the variable capacitor 5 is first connected to the detector circuit 8. Then, the control circuit 2 detects, using the detector circuit 8, the capacitance of the variable capacitor 5 such that a time constant that is the product of the capacitance of the variable capacitor 5 and the resistance of the reference resistor 23 in the detector circuit 8 is substantially the same as a reference time constant.

When the control circuit 2 completes setting of a capacitance necessary for the filter component circuit 6, the variable capacitor 5 is connected to the filter component circuit 6 so that a filtering operation is performed by the variable capacitor 5 and the filter component circuit 6.

According to the embodiments, there are accurately measure using a simple circuit provided in the semiconductor integrated circuit, a time constant generated from a circuit that employs a variable capacitor that is provided to allow variation in the element value due to the manufacturing errors and temperature characteristics of a resistive element (e.g. resistor) and a capacitive element (e.g. capacitor) in the semiconductor integrated circuit.

What is claimed is:

1. An apparatus comprising:
   a current source circuit comprising a first current source and a second current source;
   a resistor connected between the first current source and a reference potential portion;
   a switched capacitor circuit having variable capacitor, a first switch and a second switch, the first switch and the second switch connected to end of terminals of the variable capacitor, respectively, the first switch and second switch alternately switching to charge a voltage to the variable capacitor and discharge an electric charge of the variable capacitor;
   an integrating circuit having an output terminal and a first input terminal which is connected a portion between the second current source and the switched capacitor circuit, the integrating circuit for integrating a current from the portion and for exchanging into an output voltage of the output terminal; and
   a comparator comparing the voltage between one end of the resistor and an output voltage of the integrating circuit.

2. The apparatus according to claim 1, wherein the current source circuit comprises a current mirror circuit with the first current source and the second current source.

3. The apparatus according to claim 1, wherein the integrating circuit is an operation amplifier having the first input terminal, the output terminal, a capacitor and a second input terminal which is connected a portion between the first current source and the resistor, the capacitor connected between the output terminal and the first input terminal.

4. The apparatus according to claim 1, wherein the first switch has a first terminal of the first switch connected to the reference potential portion, a second terminal of the first switch connected between the resistor and the first current source, and a third terminal of the first switch connected to the variable capacitor, wherein the second switch has a first terminal of the second switch connected to the integrating circuit, a second terminal of the second switch connected between the resistor and the first current source, and a third terminal of the second switch connected to the variable capacitor.

5. An apparatus comprising:
a first variable capacitor capable of changing capacitance;
a second variable capacitor capable of changing capacitance;
a filter connected to the first variable capacitor;
a detector connected to the second variable capacitor; and
a controller for controlling the first variable capacitor in accordance with a result of the detector;
   wherein the detector comprises:
      a current source circuit comprising a first current source and a second current source,
      a resistor connected between the first current source and a reference potential portion,
      a switched capacitor circuit having switches connected to terminals of the second variable capacitor, respectively, the switches repeatedly switching capable of charging a voltage to the second variable capacitor and capable of discharging a electric charge of the variable capacitor,
      an integrating circuit having an output terminal and an input terminal which is connected a portion between the second current source and the switched capacitor circuit, an integrating circuit for integrating a current from the portion and for exchanging into an output voltage of the output terminal, and
      a comparator comparing the voltage between one end of the resistor and an output voltage of the integrating circuit.

6. The apparatus according to claim 5, wherein the current source circuit comprises a current mirror circuit with the first current source and the second current source.

7. An apparatus comprising:
a variable capacitor capable of changing capacitance;
a filter connected to the variable capacitor;
a detector connected to the variable capacitor; and
a controller for controlling the variable capacitor in accordance with a result of the detector;
   wherein the detector comprises:
      a current source circuit comprising a first current source and a second current source,
      a resistor connected between the first current source and a reference potential portion,
      a switched capacitor circuit having a variable capacitor and switches connected to terminals of the variable capacitor, respectively, the switches repeatedly switching capable of charging a voltage to the variable capacitor and capable of discharging a electric charge of the variable capacitor,
      an integrating circuit having an output terminal and an input terminal which is connected a portion between the second current source and the switched capacitor circuit, an integrating circuit for integrating a current from the portion and for exchanging into an output voltage of the output terminal, and
      a comparator comparing the voltage between one end of the resistor and an output voltage of the integrating circuit.

8. The apparatus according to claim 7, wherein the current source circuit comprises a current mirror circuit with the first current source and the second current source.

* * * * *